United States Patent [19]
Wellstood et al.

[11] Patent Number: 5,256,636
[45] Date of Patent: Oct. 26, 1993

[54] MICROELECTRONIC SUPERCONDUCTING DEVICE WITH MULTI-LAYER CONTACT

[75] Inventors: Frederick C. Wellstood, Berkeley; John J. Kingston, Oakland; John Clarke, Berkeley, all of Calif.

[73] Assignee: The Regents of the University of Calif., Oakland, Calif.

[21] Appl. No.: 586,435

[22] Filed: Sep. 21, 1990

[51] Int. Cl.$^5$ .................. H01L 39/22; B05D 5/12; H01B 12/00

[52] U.S. Cl. .................. 505/1; 505/701; 505/702; 427/62; 257/35; 257/33

[58] Field of Search .......... 357/5; 427/62, 63; 505/1, 702, 832, 874; 257/33, 35

[56] References Cited

U.S. PATENT DOCUMENTS

| | | | |
|---|---|---|---|
| 4,970,395 | 11/1990 | Kruse, Jr. | 357/5 |
| 5,019,551 | 5/1991 | Hidaka | 505/702 |

FOREIGN PATENT DOCUMENTS

| | | | |
|---|---|---|---|
| 329507 | 8/1989 | European Pat. Off. | 357/5 |
| 57-30390 | 2/1982 | Japan | 357/5 |
| 59-103390 | 6/1984 | Japan | 357/5 |
| 63-224273 | 9/1988 | Japan | 357/5 |
| 2-137379 | 5/1990 | Japan | 357/5 |
| 2-186682 | 7/1990 | Japan | 357/5 |

OTHER PUBLICATIONS

"Fabrication of Heteroepitaxial YBa$_2$Cu$_3$O$_{7-x}$-PrBa$_2$Cu$_3$O$_{7-x}$-YBa$_2$Cu$_3$O$_{7-x}$ Josephson Devices by Laser Deposition", Rogers et al, App. Phys. Lett., vol. 55, #19 Jun. 1989, pp. 2032-2034.

Koren, et al. "Epitaxial Films of YBa$_2$Cu$_3$O$_{7-\delta}$ on NdGaO$_3$, LaGaO$_3$, and SrTiO$_3$ Substrates Deposited by Laser Ablation", Appl. Phys. Lett. vol. 54, #11, Mar. 13, 1989, pp. 1054-1056.

Chan et al., "Superconducting YBa$_2$Cu$_3$O$_{7-x}$ Thin Films on Alkaline Earth Fluorides", App. Phys. Lett. vol. 54, #20, May 15, 1989, pp. 2032-2034.

Asano et al., "Epitaxy and Orientation of Eu$_1$Ba$_2$Cu$_3$O$_{7-y}$ Films Grown in Situ by Magnetron Sputtering", Jap. J. of Appl. Phys., vol. 28, #6, Jun. 1989, pp. L981-L983.

Ramesh et al., "Epitaxy of Y-Ba-Cu-O Thin Films Grown on Single-Crystal MgO", Appl. Phys. Lett. vol. 56, #22, 28 May 1990, pp. 2243-2245.

Furuyama, et al., "In situ Fabrication of Reproducible YBCO/Au Planar Tunnel Junctions with an Artificial Mgo Barrier", Japanese Journal of Applied Physics, vol. 29, No. 3, Mar. 1990, pp. L459 et seq.

Iguchi, et al. "Tunneling Characteristics of YBaCuO/MgO/Pb Planar Tunnel Junctions and Observation of Josephson Effect", Japanese Journal of Applied Physics, vol. 29, No. 4, Apr. 1990, pp. L614 et seq.

Iguchi, et al. "Tunneling Characteristics and Josephson Effect of YBaCuO Epitaxial Planar Tunnel Junctions", The Second ISTEC Workshop on Superconductivity, May 28-30, 1990.

Furuyama, et al. "In Situ Growth of Yoa$_2$Cu$_3$O$_{7-x}$ Thin Films by Reactive Co-Evaporation Technique", 2nd Workshop on High-Temperature Superconducting Electron Devices, Jun. 7-9, 1989, pp. 105. et seq.

Klepner, "Process Test Chip for Josephson Integrated Circuits", IEEE Transactions on Magnetics, vol. MAG-17, No. 1, Jan. 1981, pp. 282 et seq.

Kaplunenko, et al., "Experimental Study of the RSFQ Logic Elements", IEEE Transactions on Magnetics, vol. 25, No. 2, Mar. 1989, pp. 861 et seq.

Nagasawa, et al., "No Multilayer Planarization Technology for a Subnanosecond Jesephson 1K-bit Ram", IEEE Transactions on Magnetics, vol. 25, No. 2, Mar. 1989, pp. 777 et seq.

Jaycox, et al., "Planar Coupling Scheme for Ultra Low Noise DC SQUIDS", IEEE Transactions on Magnetics, vol. MAG-17, No. 1, Jan. 1981, pp. 400 et. seq.

Primary Examiner—Rolf Hille
Assistant Examiner—Mahshid Saadat
Attorney, Agent, or Firm—Paul R. Martin; Kathleen S. Moss; Pepi Ross

[57] ABSTRACT

A microelectronic component comprising a crossover is provided comprising a substrate, a first high T$_c$ superconductor thin film, a second insulating thin film comprising SrTiO$_3$; and a third high T$_c$ superconducting film which has strips which crossover one or more areas of the first superconductor film. An insitu method for depositing all three films on a substrate is provided which does not require annealing steps. The photolithographic process is used to separately pattern the high T$_c$ superconductor thin films.

4 Claims, 12 Drawing Sheets

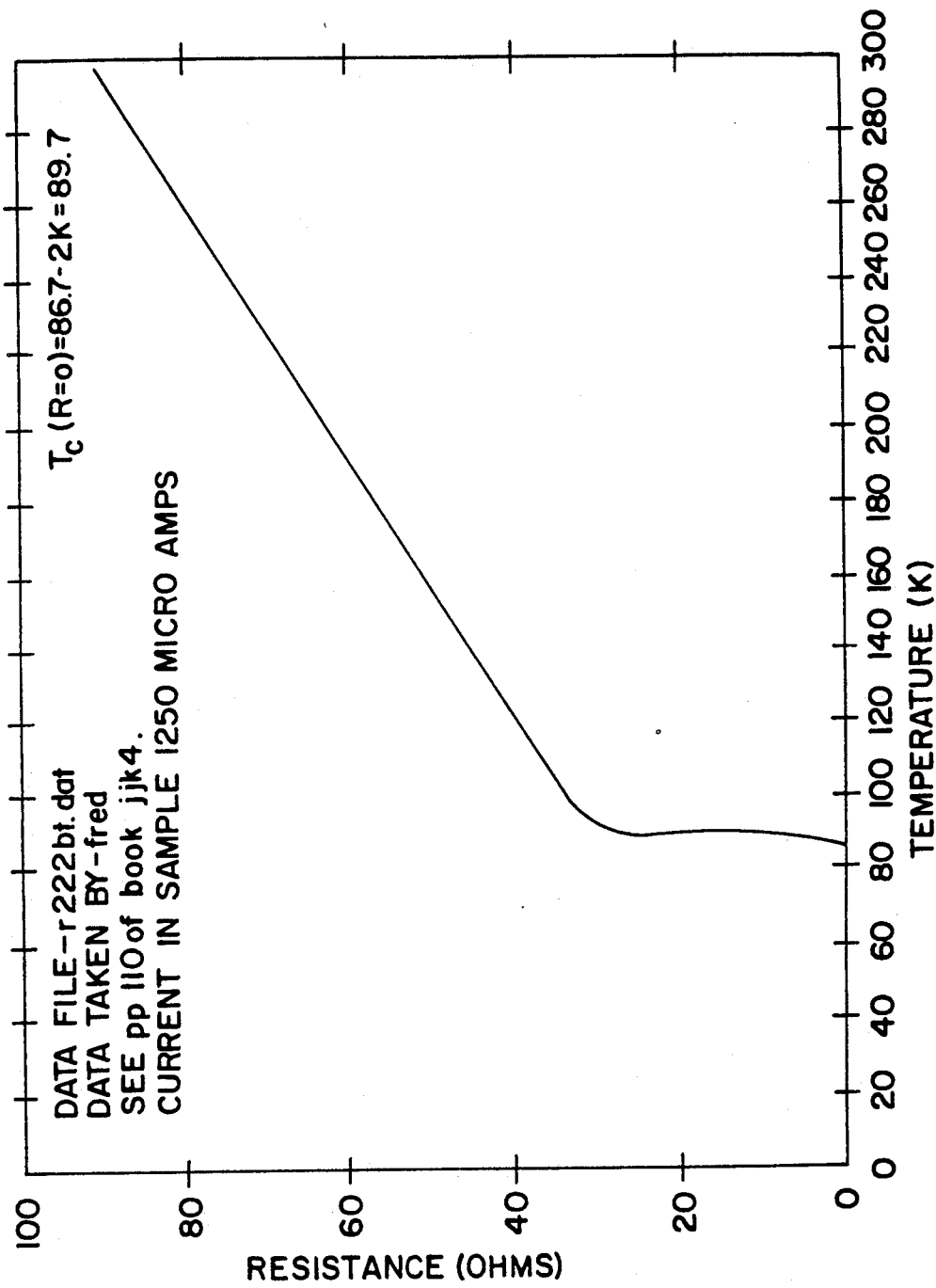

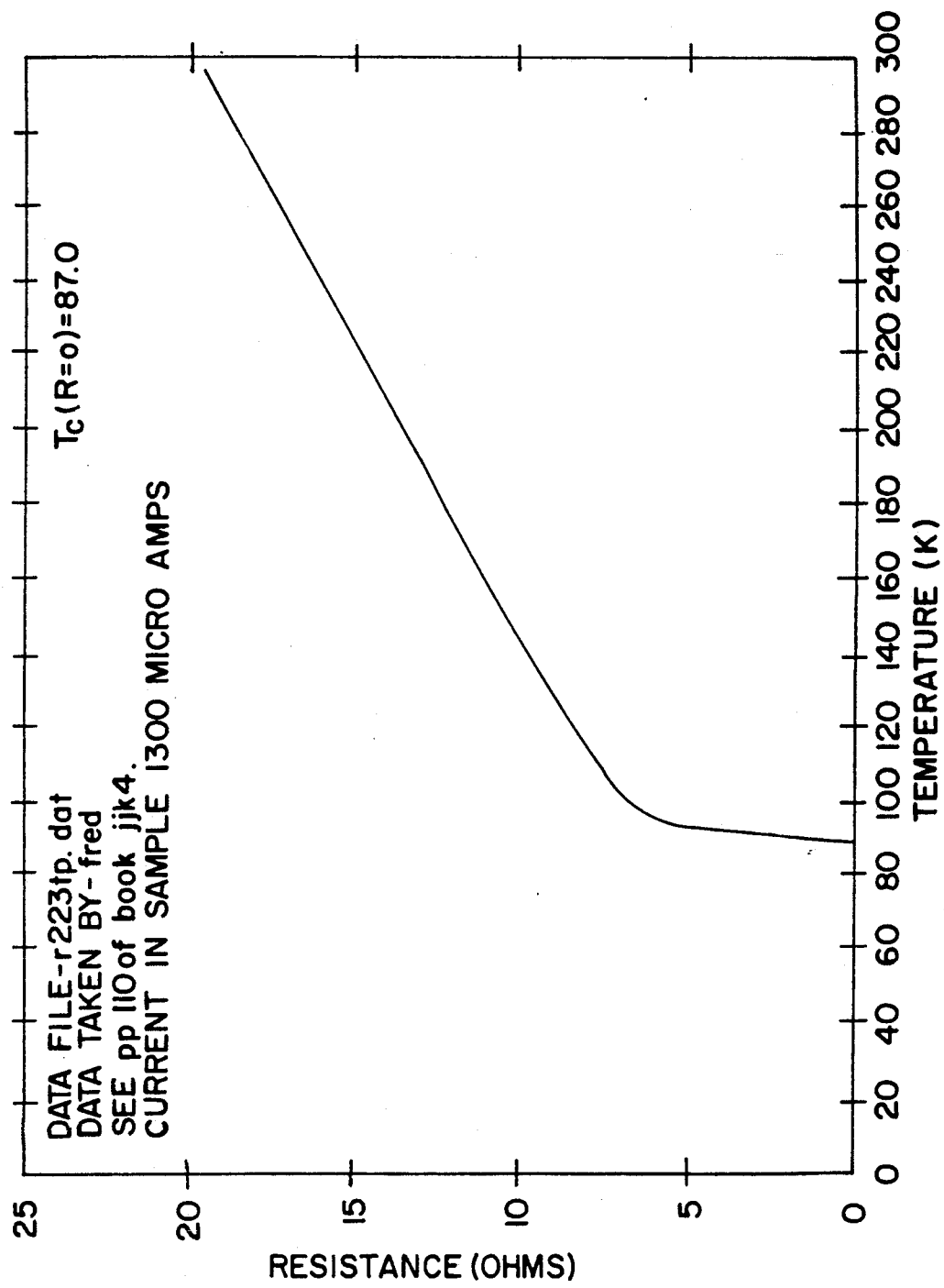

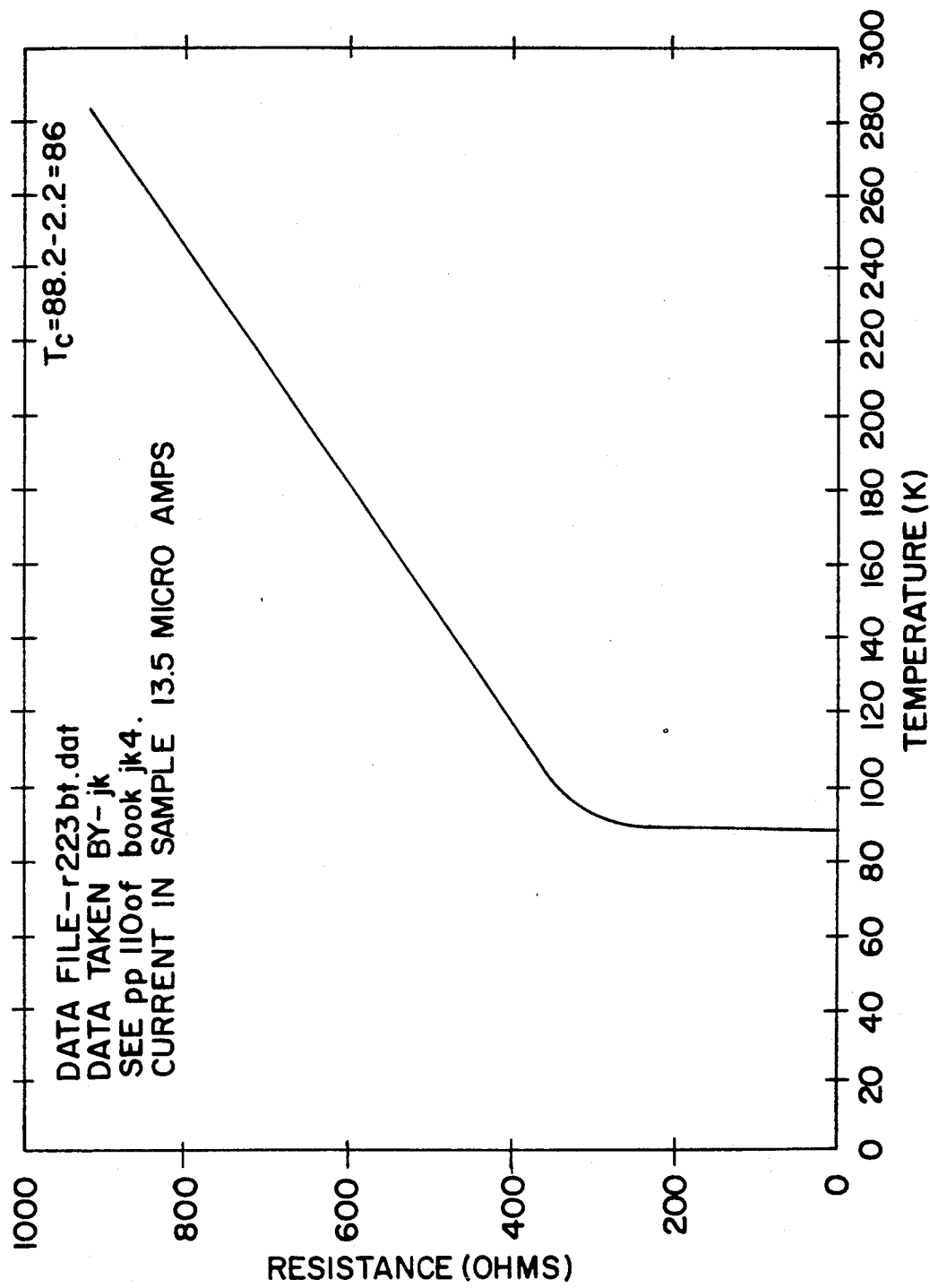

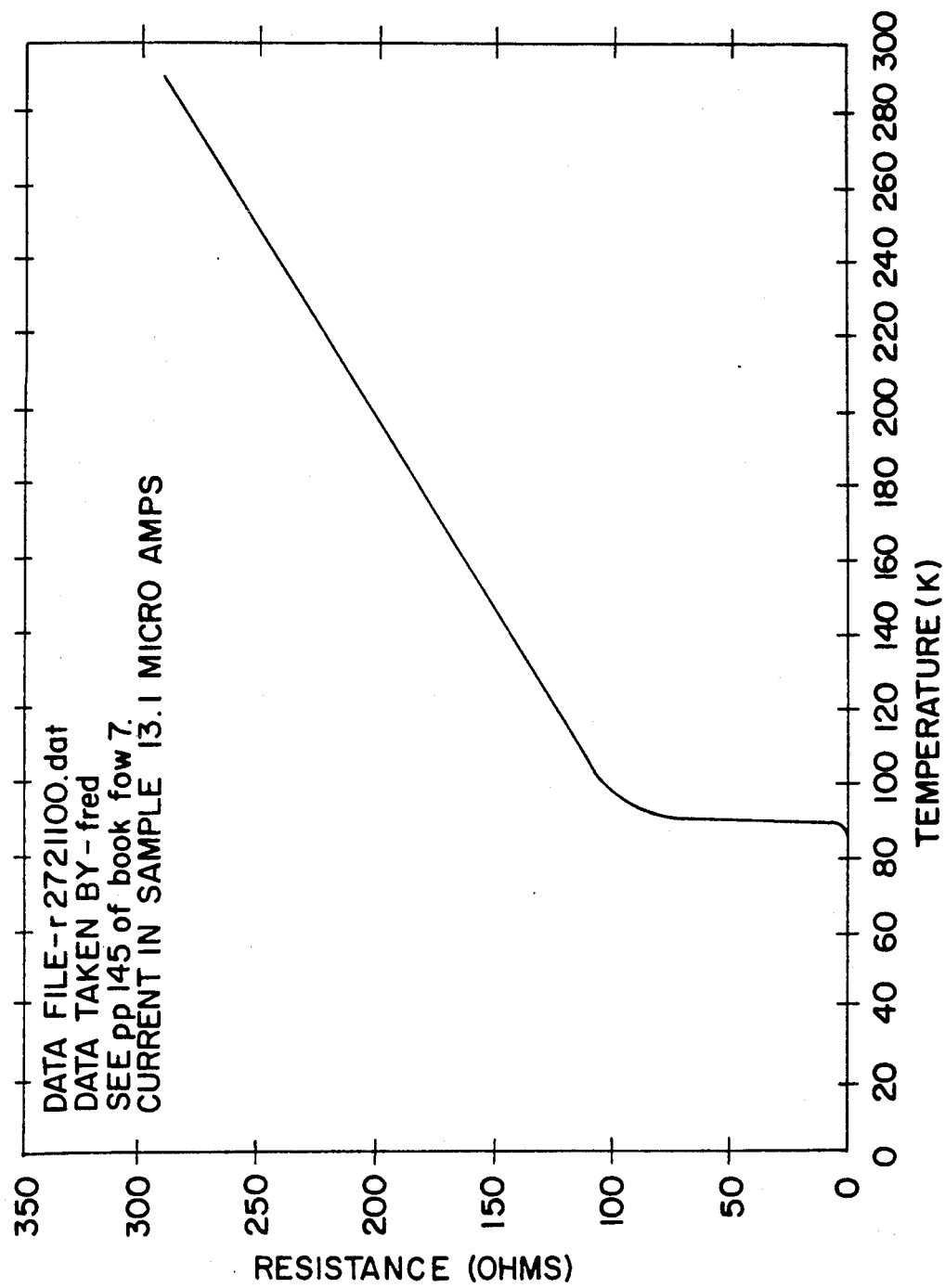

MICROELECTRONIC SUPERCONDUCTING DEVICE WITH MULTI-LAYER CONTACT

This application contains subject matter supported by the U.S. Government under Contract No. DE-AC03-76SF00098, through the U.S. Department of Energy. The government has certain rights in this invention.

This invention relates to electrical structures comprised of high transition temperature ($T_c$) superconductor materials. More particularly, the invention relates to microelectronic superconductor devices and an improved method for making such devices wherein the superconductor material has a high transition temperature.

Superconductor materials have been developed which have a high transition temperature ($T_c$), exhibiting superconductivity at temperatures up to and above the boiling point of liquid nitrogen, 77K. The ability to manufacture microelectronic devices employing high $T_c$ superconducting material promises many advantages. Such devices exhibit the advantages of devices employing low temperature superconducting material, but because they can operate in liquid $N_2$, they can be cooled much more easily and less expensively.

Unfortunately, the fabrication of microelectronic structures using high $T_c$ superconductor materials is not a trivial task, and cannot readily follow prior art techniques. For example, low $T_c$ superconductor materials, such as niobium and niobium nitride, may be fabricated using conventional techniques such as vacuum evaporation deposition, sputtering, reactive ion etching, and photolithographic patterning techniques. Examples of microelectronic structures using low temperature superconductor materials are described by Klepner in IEEE Transactions on Magnetics, January, 1981, pp. 282 et. seq., by Jaycox, et al. in the same publication at pp. 400 et. seq., by Nagasawa, et al. in IEEE Transactions on Magnetics, March 1989, pp. 777 et. seq., and by Kaplunenko, et al. in the same publication at pp. 861, et seq.

Such common fabrication techniques are not readily suited to many types of multilayer microelectronic devices employing high $T_c$ superconductor materials. The reasons for this involve the fact that, in order to be superconducting, high $T_c$ materials must have the correct crystal structure. The correct crystal structure can be achieved using an annealing step at a high temperature, for example, 850° C., after the material is deposited. However, thin films of high $T_c$ superconductor materials are highly defected and, a such annealing temperatures, will interdiffuse rapidly with adjacent layers. Since many microelectronic structures require multiple layers of different materials, an annealing step is not practical. Thus, a deposition technique which results directly in the formation of multiple heteroepitaxial layers is needed for the construction of such structures.

High $T_c$ superconductor material may be deposited as epitaxial thin films on suitable substrates at temperatures between 650° and 750° C. using laser deposition. In single layer microelectronic structures, a proper substrate surface will result in epitaxial thin films under suitable deposition conditions. However, where an insulating layer is required, such as in the case where conductors cross each other (crossover), it is difficult to achieve proper insulation and at the same time a crystal structure suitable for the deposition of a third epitaxial thin film layer.

Multilayer structures of high $T_c$ superconductor material have been reported in a number of publications in connection with tri-layer junctions that exhibit Josephson Characteristics (superconducting pair tunneling). Examples of the tri-layer junctions are described by Rogers, et al. in Appl. Phys. Lett., Vol. 55, No. 19, Nov. 6, 1989, pp. 2032 et. seq., by Iguchi, et al. in Japanese Journal of Applied Physics, Vol. 29, No. 4, April, 1990, pp. L614 et. seq., by Ienari, et al. in Second ISTEC Workshop on Superconductivity, May 28–30, 1990, pp. 125 et. seq., and by Furuyama, et al. in Second Workshop on High Temperature Superconducting Electron Devices, Jun. 7–9, 1989, pp. 105 et. seq. Such tri-layer structures are not suitable as cross-overs, however, since the intermediate layer has insufficient insulating properties for typical microelectronic crossover applications.

In addition to the need for providing insulation between high $T_c$ superconductor layers, it is also necessary to pattern the high $T_c$ superconducting layers and, in some cases, the insulating layer so that useful devices can be built. The use of photolithography on single and multilayer high $T_c$ superconducting thin film structures is well known in the art as a patterning technique performed only after all high $T_c$ superconducting films have been deposited. However, there would be a number of advantages in using the photolithographic process to separately pattern all layers of a multilayer high $T_c$ superconducting thin film structure. First, the photolithographic process is the standard technique for patterning conventional microelectronic circuits. Thus, the use of the photolithographic process opens up the possibility of using existing standard equipment to produce novel superconducting devices. Second, photolithography allows the construction of complex patterns, while other prior art methods, such as patterned shadow masks, are generally suitable only for relatively simple patterns. Third, photolithography allows a given pattern to be exposed and stepped repeatedly over a film to produce a large number of identical devices on one substrate, thus allowing mass production of devices. Fourth, photolithography also allows precise alignment of different layers. Finally, the photolithographic process allows the physical size of the patterns to be drastically reduced. Typically, the linewidths produced using the photolithographic process can be as small as a few micrometers. This is extremely important in many applications, in particular, where high speed is required or a large number of devices are to be put on a single chip.

Examples of devices which are best made using the photolithographic process are miniature muliturn coils and window contacts. A window contact is an area of electrical contact between two electrically conducting layers through a hole in an insulating layer. If the two layers are superconducting layers, a supercurrent, i.e., a current which does not encounter any electrical resistance, can flow from one superconductor layer to another superconductor layer through the hole in the insulating layer. The hole through the insulating layer is best patterned using the photolithographic process so that all the desirable advantages of using the photolithographic process described above can be realized.

The holes in the insulating layer have other applications in addition to providing window contacts. A plurality of layers can be deposited inside each hole. These layers inside the hole can be used to form superconductor-insulator-superconductor (SIS) and superconductor-normal-superconductor (SNS) junctions.

However, the ability to use the photolithographic process to separately pattern more than one high $T_c$ superconducting thin film of a multilayer structure has not been achieved by the prior art. This is because the surface of a high $T_c$ superconducting thin film becomes contaminated during the photolithographic process. Thus, it will not support the crystalline growth of an insulating layer of sufficient quality that the insulating layer will, in turn, support the crystalline growth of a second high $T_c$ superconducting thin film.

It is an object of the present invention to provide a multilayer high $T_c$ microelectronic device with an insulating layer.

It is another object of the present invention to provide an improved method for manufacturing a microelectronic device employing high $T_c$ superconductor material.

A further object of the invention is to use the photolithographic process to separately pattern thin films of high $T_c$ superconductor materials and insulators in multilayer structures.

It is another object of the invention to facilitate mass production of microelectronic devices utilizing high $T_c$ superconductor material.

A further object of the invention is to reduce the physical size of microelectronic devices employing high $T_c$ superconductor material.

It is yet another object of the present invention to provide an improved method for producing a multilayer microelectronic device wherein two layers of high $T_c$ superconductor materials are separated by an insulating layer.

It is still another object of the present invention to provide an improved method for producing window contacts in a multilayer microelectronic device employing high $T_c$ superconductor material.

A further object of the present invention is to deposit a plurality of layers in the holes of the insulating layer.

These and other objects will become apparent from the following description, accompanying drawings, and from the practice of the invention.

SUMMARY OF THE INVENTION

The present invention provides a method to separately pattern more than one high $T_c$ metal oxide superconductor film using the photolithographic process. The photolithographic process can be applied individually to all superconducting and insulating layers of superconductor film in a crossover or similar multilayer structure.

In a preferred embodiment, the method of the invention comprises depositing in situ a high $T_c$ metal oxide superconductor film on a substrate at a temperature below 800° C. The deposited film is then patterned using the photolithographic process. The surface of the deposited film is then restored so as to support epitaxial or highly oriented microstructure in subsequent deposits. An insulating film is then deposited on at least part of said first film, said insulating film being comprised of a material having high resistivity at temperatures below $T_c$, and having a microstructure which is epitaxial or highly oriented sufficient to support epitaxial growth thereon of a third layer.

The present invention also provides a microelectronic device comprising a substrate and a first superconductor thin film of high $T_c$ metal oxide superconductor material. The first superconducting thin film is covered by an insulating thin film having a plurality of holes. The insulating film comprises a material having high resistivity at temperatures below $T_c$, and has a microstructure which is epitaxial or highly oriented sufficient to support epitaxial growth thereon of a third layer.

DESCRIPTION OF THE FIGURES

FIGS. 3A-C are plots of resistance versus temperature of a photolithographically patterned crossover which is etched using nitric acid. FIG. 3A is the resistance versus temperature plot of the upper YBCO layer. FIG. 3B is the resistance versus temperature plot of the $SrTiO_3$ insulating layer measured between the upper and the lower YBCO layers. FIG. 3C is the resistance versus temperature plot of the bottom YBCO layer.

FIGS. 4A-C are plots of resistance versus temperature of a photolithographically patterned crossover which is etched using an argon ion mill. FIG. 4A is the resistance versus temperature plot of the upper YBCO layer. FIG. 4B is the resistance versus temperature plot of the $SrTiO_3$ insulating layer measured between the upper and the lower YBCO layers. FIG. 4C is the resistance versus temperature plot of the bottom YBCO layer.

FIG. 6 shows resistance versus temperature data for a window contact with all the layers patterned photolithographically according to the present invention.

DESCRIPTION OF THE PREFERRED EMBODIMENT

Figure 1:
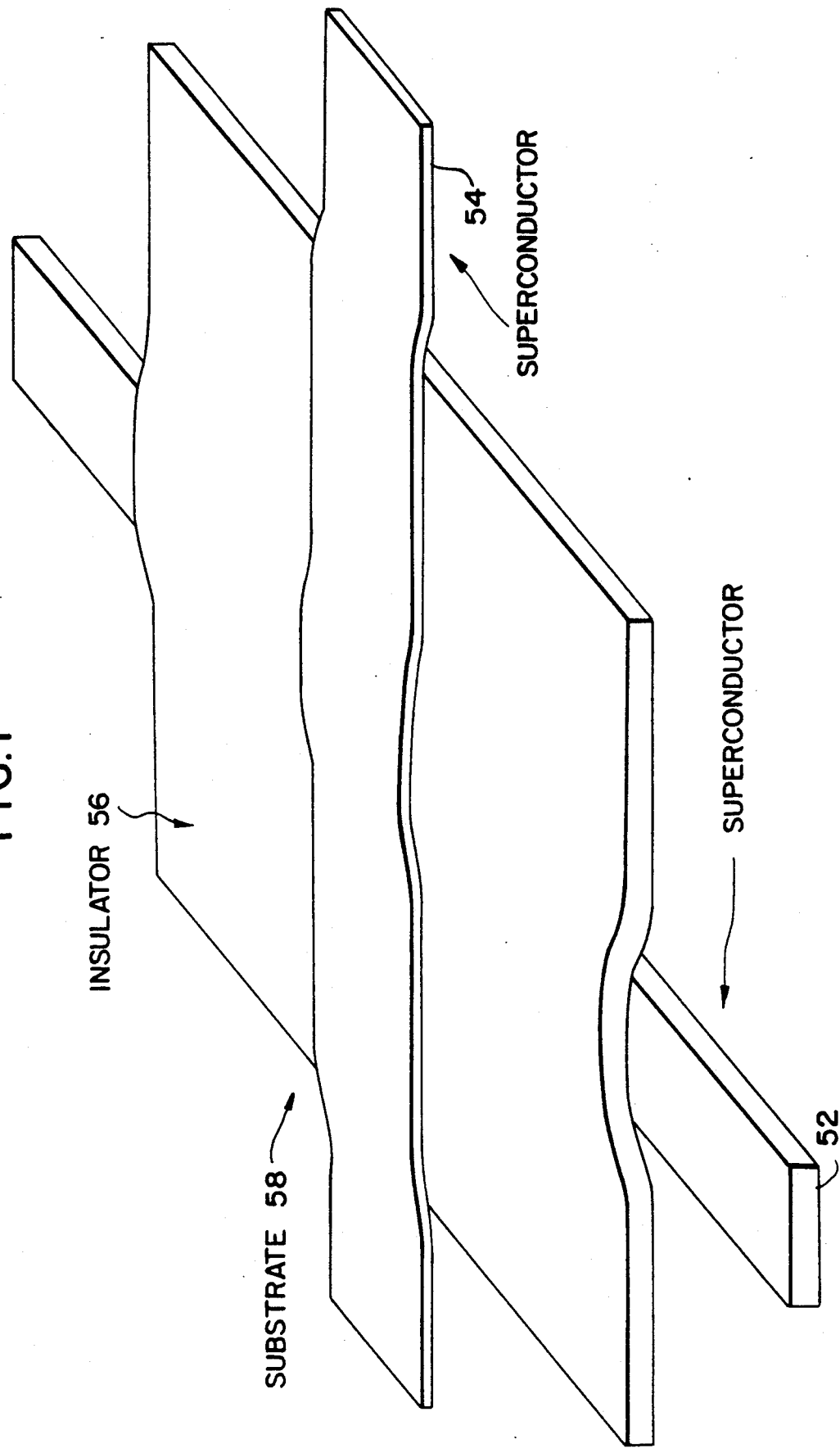
FIG. 1 is a perspective view of a portion of a crossover patterned using the photolithographic process.

Methods are known in the art for the deposition of single layers of thin films of the class of high temperature superconductors know as ceramic oxides or metal oxides, of which the most well known is $YBa_2Cu_3O_x$ (x is a positive number up to 7.0), also known as YBCO and sometimes referred to as 123 mixed metal oxide, based on the stoichiometric proportions of yttrium, barium and copper. However, to produce microelectronic circuits of any complexity, there is a need to develop techniques for depositing multilayer structures.

One important multilayer structure is an insulated crossover, which allows two thin film superconductors to overlap or to cross while maintaining electrical isolation. Virtually all electronic circuits of any complexity require such insulated crossovers. For example, one such utilization of a crossover is in the construction of a thin-film multi-turn superconductor coil. The crossover problem is encountered in making an electrical contact to the inner turn of the coil.

In addition to the electrical considerations, there are the additional problems associated with making a crossover structure using high $T_c$ superconductor thin films. Most thin films are highly defected in nature and thus interdiffusion proceeds much more rapidly than in a single crystal. If the as-deposited film does not have the correct crystal structure, an annealing step is typically required to achieve the desired superconducting characteristics. For YBCO, the annealing temperature is typically about 850° C. However, at a temperature of 850° C., interdiffusion is so fast that a tri-layer structure which requires such a post-annealing temperature is probably impractical to fabricate. Therefore, to fabricate a tri-layer structure comprising mixed metal superconductor one needs to devise an in situ deposition process which is compatible with relatively low substrate temperature, short deposition time and a way to avoid high temperature annealing.

In order to employ high $T_c$ ceramic oxide films for crossovers, the insulating layer should be able to grow epitaxially or in a highly oriented manner both on the substrate and on the ceramic oxide, as well as to have good coverage of and adhesion to the ceramic oxide and the substrate, particularly at edges and over irregularities. It is also important that the insulating layer has a high resistivity and provides sufficient insulation between the upper and lower superconducting layers at temperatures below the transition temperature ($T_c$) of the ceramic oxide which is utilized in the device.

In addition to the need for an insulating layer, the high $T_c$ ceramic oxide layers must be patterned in order to create microelectronic circuits. Patterning using photolithographic process has many advantages over prior art patterning methods. However, the insulating layer may not grow with the necessary crystal structure on the surface of a ceramic oxide thin film which has bee contaminated during the photolithographic processing. In particular, YBCO is very reactive. It has been well documented that the surface of YBCO thin films can easily be contaminated even with exposure to air. Thus, the surface of the bottom YBCO film patterned photolithographically could be sufficiently contaminated so that it would not support growth of the insulating layer and the top YBCO layer with the necessary crystal structure. Defects in the structure of the insulating layer could result in short circuits between the two YBCO layers. In addition, defects in the crystalline structure of the upper YBCO layer could severely degrade the superconducting properties of the top YBCO layer, i.e., a reduction in superconducting transition temperature and/or a reduction in critical current.

There is another problem associated with using the photolithographic patterning technique which could also degrade the performance of the crossovers. When a film is patterned into lines with this technique, the lines appears as rectangles when viewed in cross section. Referring now to FIG. 1 which shows a perspective view of a portion of a crossover. A superconducting ceramic oxide film is photolithographically patterned into line 52 on top of a substrate 58. An insulating layer 56 is deposited so that another line 54 patterned from a top superconducting ceramic oxide film is insulated from line 52. The sides of the lines 52 patterned using photolithographic process is roughly perpendicular to the surface of the film. The rectangular geometry resulting from photolithographic processing makes it difficult to deposit an insulating layer which can sufficiently cover the corners of the bottom YBCO film so as to prevent short circuits. In addition, it is more difficult to deposit a top YBCO film with good superconducting properties upon this insulating layer because the top YBCO film has to climb over the "steps" created by line 52.

The present invention is based, in part, on the introduction of an additional step after the photolithographic process so that the problems of defects in epitaxial growth using the photolithographic process on high $T_c$ ceramic oxide can be avoided. More specifically, the additional step involves restoring the surface of the bottom ceramic oxide layer after subjecting it to photolithographic patterning. Restoration is the removal of the contaminated surface layer of the film thereby leaving a surface suitable to support the epitaxial growth of subsequent layers.

The restoration step is preferably performed by submerging the substrate and the photographically patterned ceramic oxide film in a chemical etchant which is substantially free of water. This is because the surface of the YBCO layer can easily be contaminated by water. Thus, a chemical etchant which is substantially free of water can clean the surface to facilitate the deposition of other layers. An example of such chemical etchant is a mixture of bromine in methanol. The mixture has been shown by others, such as Vasquet, et al., in Appl. Phys. Lett., December, 1988, pp. 2692 et. seq., to be able to restore the surface of YBCO and other high temperature superconductors.

The present invention is also based, in part, on the successful deposition of an insulating thin film layer which is thick enough to achieve sufficient insulation and to support the deposition of a third layer of either metal, such as gold or silver, another insulating layer or a high $T_c$ superconducting material. This insulting layer can also be patterned using the photolithographic process.

A particularly desirable device which is best made using the photolithographic process on the insulating layer is a window contact. A window contact is an area of electrical contact through a hole in an insulating layer between a superconductor layer and another layer which can be either a metal or another superconducting layer. If the contact is between a lower ceramic oxide layer and an upper ceramic oxide layer, a supercurrent, i.e., a current which does not encounter any electrical resistance, can flow from one ceramic oxide layer to another ceramic oxide superconductor layer through the holes in the insulating layer. Contacts between a lower ceramic oxide layer and a metal can be used to make connections to normal metal circuitry.

Contacts between two conducting layers separated by an insulating layer have been made by the prior art at the edges of the insulating layer separating the two superconducting layers. The use of window contacts to provide electrical coupling between layers are superior to the methods used in the prior art because contacts can be made anywhere in the insulating layer. These holes are best fabricated using photolithography to provide precision in alignment among the layers and reduction in the size of the holes. As a result, complicated microelectronic devices can be fabricated.

In addition to allowing the use of photolithographic process on the lower ceramic oxide layer and the insulating layer, the present invention also allows the use of the photolithographic process on the top ceramic oxide layer. The application of the photolithographic process to the top ceramic oxide layer presents other problems. In particular, the use of a chemical etch, which is widely used in a typical photolithographic process involving only a single high $T_c$ superconducting layer, could damage the lower ceramic oxide film if the insulating layer does not provide sufficient protection to the lower ceramic oxide film from chemical attack. In order to avoid the possibility of etching through the insulating layer, an Ar ion mill can be used instead of the chemical etch. In many instances, however, a chemical etch can be safely used. In addition, it has been found that the thickness of the insulating layer and the milling time should be well controlled so that the material underlying the top ceramic oxide layer is not damaged.

Accordingly, the present invention is directed to a process for making microelectronic devices wherein crossovers of superconductor metal oxides can be made and wherein the entire microelectronic device can be made without destroying the electrical properties of the materials which have already been deposited and which are to be deposited. The present invention is also directed to a multilayer device with one or more window contacts.

The thin films are deposited using a laser to ablate the targets, which are, preferably, stoichiometric YBCO, YSZ, or $SrTiO_3$ targets. The deposition can be done in a vacuum deposition chamber with the laser focused onto the target and with a substrate holder which can heat the substrate to the desired temperature. The substrate may be any suitable material, of which many are known to those skilled in the art, such as MgO, $SrTiO_3$, YSZ, and $LaAlO_3$. The substrate may also be materials which do not support the growth of high quality high $T_c$ superconducting layers, such as silicon and sapphire wafers, but can be coated with materials which support such growth.

The substrate heater is first outgassed and the substrate temperature is raised to the range of about 650° to 750° C. (for deposition, for example, of YBCO) while the deposition chamber is evacuated to about 2 to 5 $\mu$Torr. A preferred temperature for heating the substrate is about 730° C. for YBCO. Oxygen is then bled into the system, since it is required to maintain proper stoichiometry in the deposited film. Typically, oxygen pressure within the vacuum chamber of about 150 to 250 mTorr, preferably about 190 mTorr, is useful for YBCO deposition.

Typically, prior to deposition, the target surface is cleaned with laser pulses and then the high $T_c$ ceramic oxide, such as YBCO, is deposited by focusing the laser on a stoichiometric YBCO target formed by pressing and sintering calcined powder into disks. Preferably, the first layer is deposited to a thickness of about 0.1 to 0.6 $\mu$m (for YBCO layers); however the thickness may be varied depending on the final application and desired current carrying capacity of the microelectronic device. A thickness in the range of 0.2-0.4 $\mu$m is most preferred. After deposition, the chamber is filled with oxygen to about 700 Torr and the substrate block allowed to cool to about 450° C. in about 15 minutes. After further cooling to a handleable temperature (about 100° C. or less), the chamber may be opened and the substrate with the deposited ceramic oxide layer can be removed for patterning using the photolithographic process.

When using photolithography to pattern a thin film, the film is coated with an organic chemical called photoresist. An example of a photoresist is Shipley Microposit 1400-31. The photoresist is baked dry, exposed to ultraviolet light in the desired pattern, and developed in an organic chemical developer such as Microposit developer so that a portion of the photoresist responsive to the ultraviolet light passing through the pattern is removed. The portion of the thin film which is not covered by the photoresist can then be etched away using either an ion mill or various chemical etchants. An example of a suitable etchant is dilute nitric acid. After etching is completed, the resist covering the remaining parts of the ceramic oxide film is stripped using acetone.

At this point, the surface of the ceramic oxide film is restored using a solution of bromine in methanol before depositing the final two layers. The concentration of the solution is preferably 2% bromine. The substrate with the ceramic oxide thin film is submerged in the restoring solution for preferably 30 seconds or less, then rinsed in pure methanol and blown dry. Immediately afterwards, it is mounted in the laser system's vacuum chamber in preparation for deposition of the insulating layer.

An appropriate evaporation mask, if desired, may be placed on top of the substrate. The vacuum chamber is closed and evacuated while the substrate is outgassed at about 200° C. This low temperature minimizes the loss of oxygen from the ceramic oxide layer. After the pressure within the chamber is lowered, preferably to about 3 to 5 $\mu$Torr, the substrate temperature is rapidly raised to a suitable temperature for deposition of the insulator, (about 680° C. for $SrTiO_3$ deposition) and oxygen is bled in to obtain about 190 $\mu$Torr pressure. The target is cleaned with the laser, before a suitable insulator such as $SrTiO_3$, yttrium stabilized zirconia (YSZ), magnesium oxide (MgO), lanthanum aluminate ($LaAl_2O_3$), praseodymium barium copper oxide ($PrBa_2Cu_3O_7$), or yttrium oxide ($Y_2O_3$) is deposited, preferably, for a period sufficient to form a 0.1 to 0.5 $\mu$m thick layer or such that it is sufficiently insulating. It is useful to use the same cooling procedure as in the first deposition.

If it is desirable to pattern the insulating layer using the photolithographic process, the same procedure as described in patterning the lower YBCO layer can be used. However, it is found that a restoration step is not necessary for the insulating layer. It may be understood that the pattern which can be etched on the insulating layer includes holes, strips, and other desirable figures.

If it is desirable to create a beveled wall for the hole, one can defocus the projection mask aligner during exposure of the photo-resist. The insulating layer is etched using an ion milling. The defocused pattern allows some etching at the peripheral of the hole thereby forming a beveled wall. A hole with beveled wall is especially desirable for window contact. This is because the beveled wall provides a gentle slope to guide the third layer into the hole.

The third layer can either be metal, another insulating layer, or another YBCO layer. Metal can be deposited on the insulating layer using a thermal evaporation process, such process is well known in the art. The metal deposited can make contact with the lower YBCO layer through the holes etched in the insulating layer so that signals can be coupled to and from the lower YBCO layer.

If it is desirable to deposit YBCO as a third layer, the sample and a stoichiometric YBCO target is placed in the chamber. Outgassing and deposition may be accomplished as in the first deposition step. The third layer may usefully be deposited to a thickness of about 0.1 to 0.5 $\mu$m, if the layer is, for example, YBCO. The third layer may be patterned by using a mask or by photolithography.

If the third layer is patterned using the photolithographic process, the same procedure as described in patterning the lower YBCO layer can be used with two modifications. First, in many instances, chemical etchants cannot be used in the etching step and one must use an ion mill. This is to protect the lower YBCO film from chemical attack by the acid. Second, there is no need for restoring the surface of the top YBCO film.

It may be understood that additional layers can also be deposited and patterned using the photolithographic methods described above.

Holes with beveled walls in the insulating layer are also useful for making superconductor-insulator-superconductor (SIS) and superconductor-normal-superconductor (SNS) junctions. After milling the defocused pattern to expose the underlying YBCO layer, a series of layers can be deposited inside each hole. The first layer of the series is preferably a thin YBCO layer designed to restore the surface of the underlying YBCO layer damaged during ion milling. An insulating layer or a normal metal layer could be deposited on top of the thin YBCO layer. A upper YBCO layer could be deposited on top of the intermediate insulating or normal metal layer. Upon patterning of the upper YBCO layer, a junction could be fabricated. A SIS junction could be produced if the intermediate layer is an insulating layer. A SNS junction could be produced if the intermediate layer is a normal metal layer.

Figure 8:
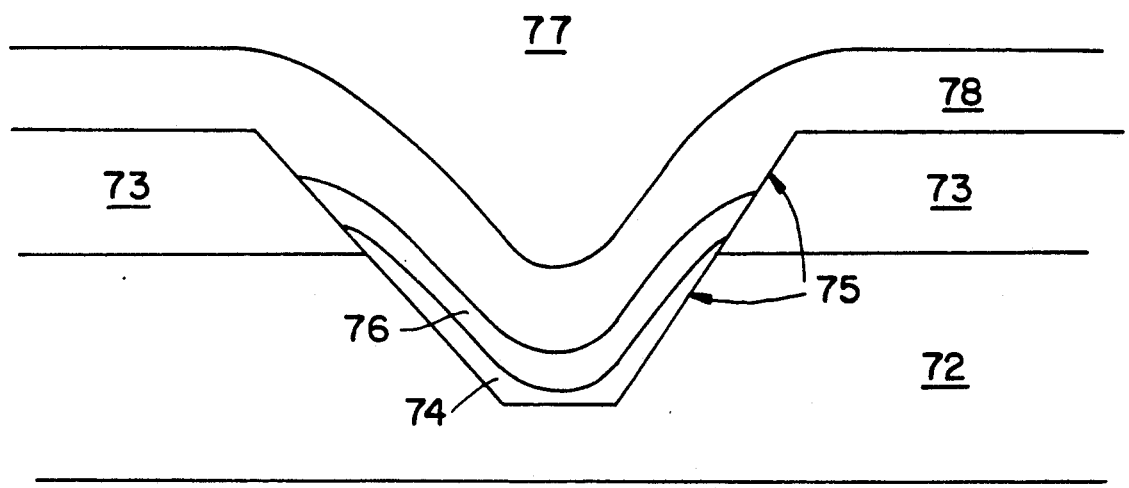
FIG. 8 shows a hole with multiple layers deposited within according to the present invention.

Referring to FIG. 8 there is shown a SNS or SIS junction according to the present invention. An insulating layer 73 with a beveled wall 75 is positioned above a lower YBCO thin film 72 forming a hole 77. Beveled wall 75 extends into lower YBCO film 72. A first layer 74, preferably YBCO, is deposited inside hole 77. A second layer 76, either a insulator or a normal metal, is deposited on top of first layer 74. A third layer 78, preferably YBCO, is deposited on top of second layer 76.

Figure 2A:
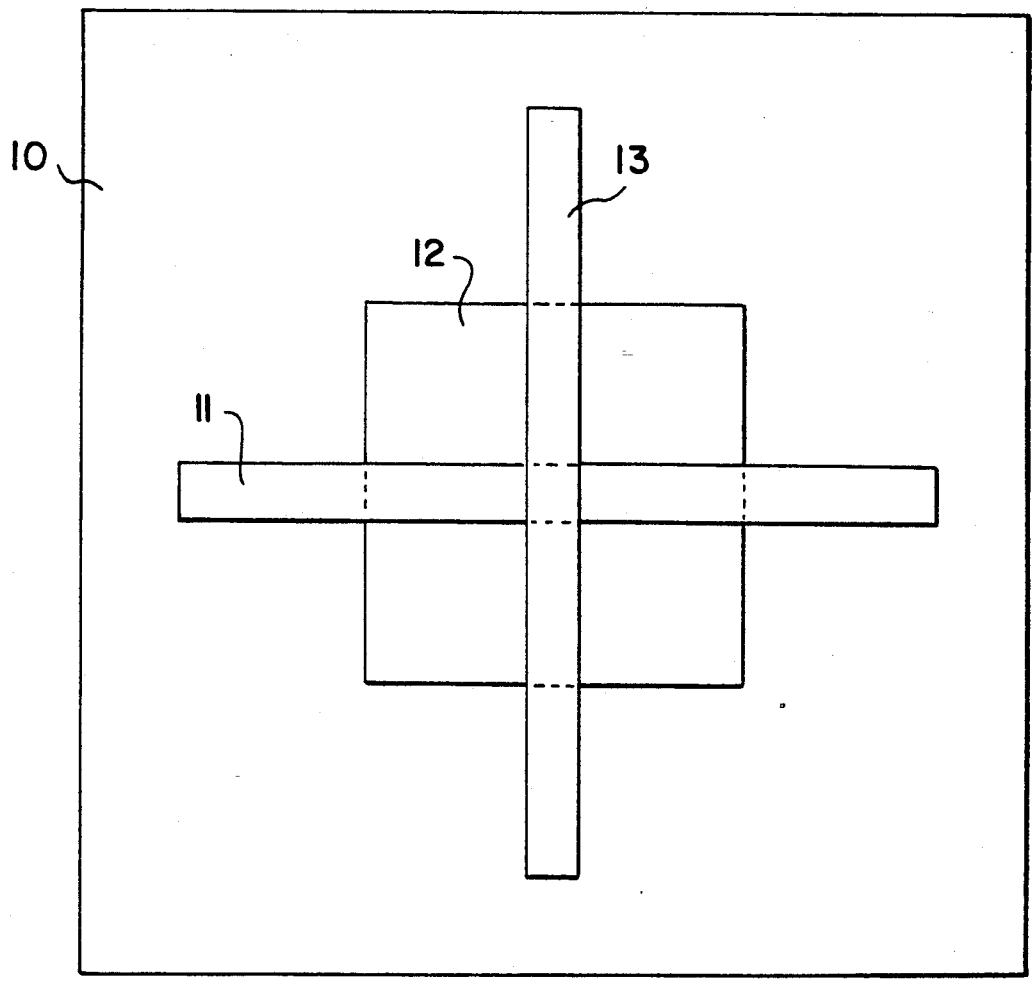
FIGS. 2A and 2B are, respectively, a plan and side view of an example of a high $T_c$ microelectronic crossover element constructed according to the present invention.

Referring to FIG. 2 there is shown a microelectronic device having a high $T_c$ superconductor crossover in accordance with the present invention. Referring to FIG. 2A, a substrate 10 which is receptive to YBCO and $SrTiO_3$, is utilized. The preferred substrate is MgO having a polished surface. The first layer 11 comprises a strip metal oxide superconductor. The second layer 12 is insulating $SrTiO_3$ which, as shown, only partially covers the first layer and specifically only covers the portion of layer 11 where the crossover will occur. The third layer 13 comprises YBCO in the form of a strip that crosses over layer 11 where it is covered by layer 12.

Figure 2B:
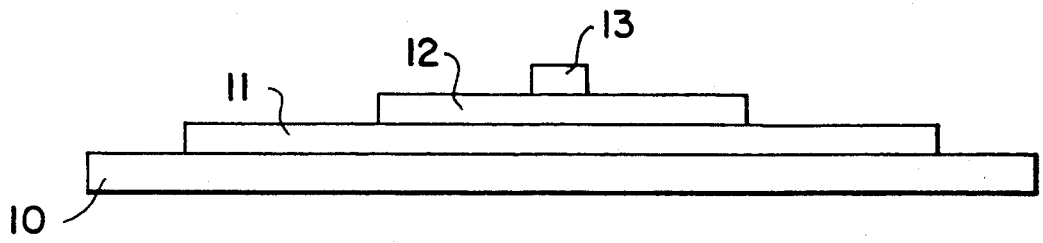

Referring to FIG. 2B, there is shown a side view of the device shown in 2A wherein the numerals 10, 11, 12, and 13 are as described above.

The following examples are provided by way of illustration and are not intended to limit the invention in any way.

EXAMPLE 1

A $12.5 \times 12.5 \times 1$ mm$^3$ cleaved and polished (100) MgO substrate was cleaned successively in an ultrasonic bath with xylene, trichlorethylene, isopropyl alcohol and ethanol, rinsed with methanol, and blown dry with $N_2$. The superconductor films are deposited from stoichiometric YBCO targets pressed and sintered from calcined powder into disks 25 mm in diameter and 3 mm thick. The insulating layer is deposited from $SrTiO_3$ powder pressed into a disk of the same size. Before each deposition, the surface of the targets are ground with #400 emery paper, polished on a latex sheet and blown with $N_2$. Each layer is deposited in turn using the 248 nm pulses (18 ns full Width at half maximum) from a Questek 2820 excimer laser. A $5.4 \times 14$ mm$^2$ aperture selects the uniform portion of the beam, which is focused by a 0.15 m focal length lens onto the target at an angle of incidence of 45°. The target is glued to one end of a copper cylinder that rotates at about 60 rpm; the bearings for the shaft are mounted in a water-cooled block in a diffusion-pumped vacuum system. The substrate is clamped to a heater block which is coated with a layer of silver paste to insure good thermal contact. This block is resistively heated, and its temperature is monitored by an embedded Chromel-Alumel thermocouple. The substrate is 60 mm from the target, and aligned to intercept the central portion of the plume emanating from the target. A water-cooled plate partially shields the target from the thermal radiation emitted by the substrate heater block to prevent melting of the surface of the target.

The first step in the process is to outgas the heater and substrate by increasing the temperature to 740° C. as the chamber is evacuated to 5 $\mu$Torr. Then, the temperature is held constant while the gate valve is throttled and $O_2$ is bled in to maintain a pressure of 190 mTorr. The target is cleaned with 300 laser pulses at a rate of 5 per second with an energy density of 1.3 Jcm$^{-2}$. The first layer of YBCO is deposited for 6 minutes, at the same repetition rate and fluence, to a thickness of about 0.4 $\mu$m. The chamber is then back-filled with $O_2$ to 1 atmosphere and the heater power is reduced to allow the block to cool to 450° C. in about 15 minutes.

The sample is allowed to further cool down to 100° C. or less in another 15 minutes. The sample is then dismounted from the heater block in preparation for patterning. Shipley Microposit 1400-31 photoresist is spun on the YBCO film for 30 sec at 5000 RPM and baked at 70° C. for 5 minutes. This produces a ½ to 1 micrometer thick layer of resist that entirely covers the YBCO film. The desired pattern is then exposed on the resist using a projection mask aligner. The resist is developed for 60 seconds using Microposit developer. The portion of the thin film which is not covered by the photoresist can then be etched away using either an ion mill or various chemical etchants. An example of a suitable etchant is dilute nitric acid.

When using nitric acid in etching, the sample is submerged in a 0.1% solution of nitric acid in water for about 45 seconds until the film is entirely etched in those regions where the resist has been removed by the developer. The substrate is then rinsed in water and blown dry.

When using an ion mill in etching, the substrate is clamped on a large copper block heat sink beneath an ion mill in a vacuum system. After evacuation is complete, argon (Ar) is bled into the system and a beam of Ar ions is used to etch away the chosen portions of the YBCO film. Typically, a 300 nm thick film is milled for about 15 minutes in a 450 V, 1.5 mA/cm$^2$ beam of Ar ions.

After etching is completed by either method, the resist covering the remaining parts of the YBCO film is stripped using ethanol or acetone in an ultrasonic bath. At this point, the surface of the YBCO film is restored by submerging the substrate in a solution of 2% bromine in methanol for 30 seconds. The sample is rinsed in pure methanol and then blown dry. Immediately afterwards, the sample is mounted in a laser system's vacuum chamber in preparation for deposition of the insulating layer.

An appropriate evaporation mask, if desired, may be is placed on top of the substrate and both are clamped to the eater block. The YBCO target is replaced with a polished SrTiO$_3$ target. As the chamber is evacuated to 3 $\mu$Torr, the heater block is outgassed at the relatively low temperature of 200° C. to minimize the loss of oxygen from the YBCO layer. The block temperature is then rapidly raised to 680° C., O$_2$ is bled in to 190 mTorr, and the target is cleaned as described above. After opening the shutter, SrTiO$_3$ is deposited for 8 minutes at a repetition rate of 4.8 Hz and a laser fluence of 1.3 Jcm$^{-2}$. The same cooling procedure is used.

After removing the evaporation mask and inserting a polished YBCO target, the substrate is outgassed at 200° C. until the pressure falls to 3 $\mu$Torr. The temperature is quickly raised to 740° C. and O$_2$ is bled in to 200 mTorr. The third layer is deposited for 7 minutes at a repetition rate of 4.8 Hz and a laser fluence of 1.3 J/cm$^2$. After the usual cooling procedure, the sample is removed. This layer can also be patterned using either an evaporation mask or the photolithographic process used on the lower YBCO layer.

If it is desirable to pattern the top layer using the photolithographic process. Shipley Microposit 1400-31 photoresist is spun on the sample at 5000 RPM for 30 seconds, and then baked at 70° C. for 5-7 min. This produces a $\frac{1}{2}$-1 $\mu$m thick layer of resist. The pattern is then exposed, and the resist developed in microposit developer for approximately 60 seconds. The back of the sample is then coated with vacuum grease and clamped onto a large Cu block heat sink, and etched for a total of approximately 10 to 20 min in a 450 V, 1.5 mA/cm$^2$ beam of Ar ions. To prevent heating damage to the YBCO, the milling can be done in intervals of 5 min with approximately 15 min cooling intervals between, and aluminum foil may be used to protect portions of the device that require less etching time. After milling, the photoresist is stripped off in 30 sec in an ultrasonic ethanol bath.

To reduce the particle density on the deposited YBCO film to typically 1 per 2500 $\mu$m$^2$, it is preferred that the YBCO target face be polished before deposition, and that the laser pulse power/unit area be lowered to close to the minimum necessary to yield high quality films. A further reduction of particle density can be achieved by increasing the area of the target that is ablated by the laser, and/or by polishing the target face during deposition. The elimination, or at least the minimization of the density of 1 $\mu$m particles on the deposited film may be desirable in multilayer structures such as an insulated crossover, and is particularly important in a structure with a thin insulating layer such as a tunnel junction. The electrical properties of the three-layer component were measured using a 4-terminal arrangement, making contacts to the films with pressed Indium pellets.

Figure 3A:
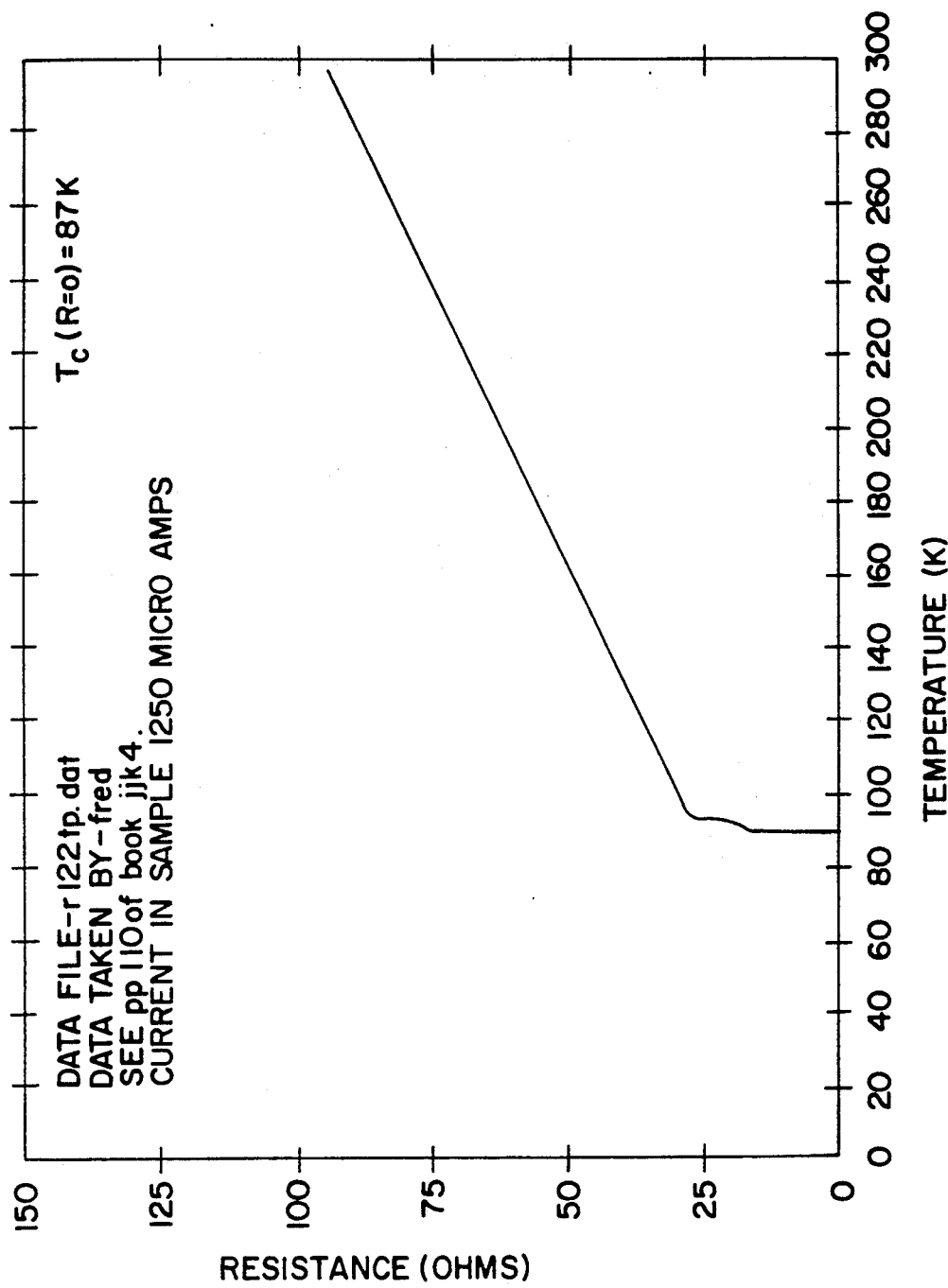
Figure 3B:
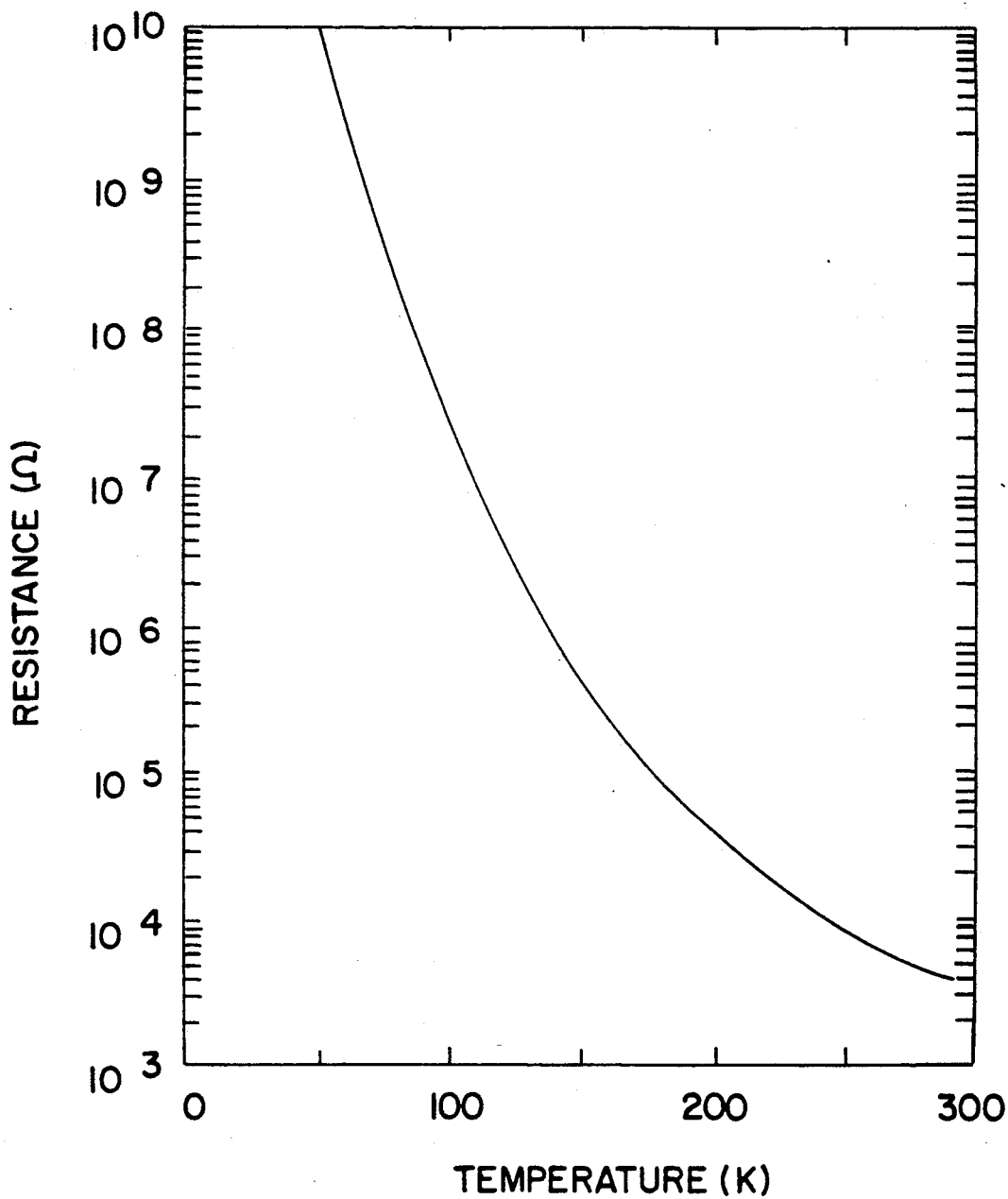

FIGS. 3A-C show resistance versus temperature data of a crossover with its lower YBCO layer photolithographically patterned and etched using nitric acid (HNO$_3$). FIG. 3A is of the resistance versus temperature plot of the upper YBCO layer. The transition temperature, T$_c$, is 87K. FIG. 3B is the resistance versus temperature plot of the SrTiO$_3$ insulating layer measured between the upper and the lower YBCO layers. FIG. 3C is the resistance versus temperature plot of the bottom YBCO layer. The transition temperature, T$_c$, is 84.7K.

Figure 4B:
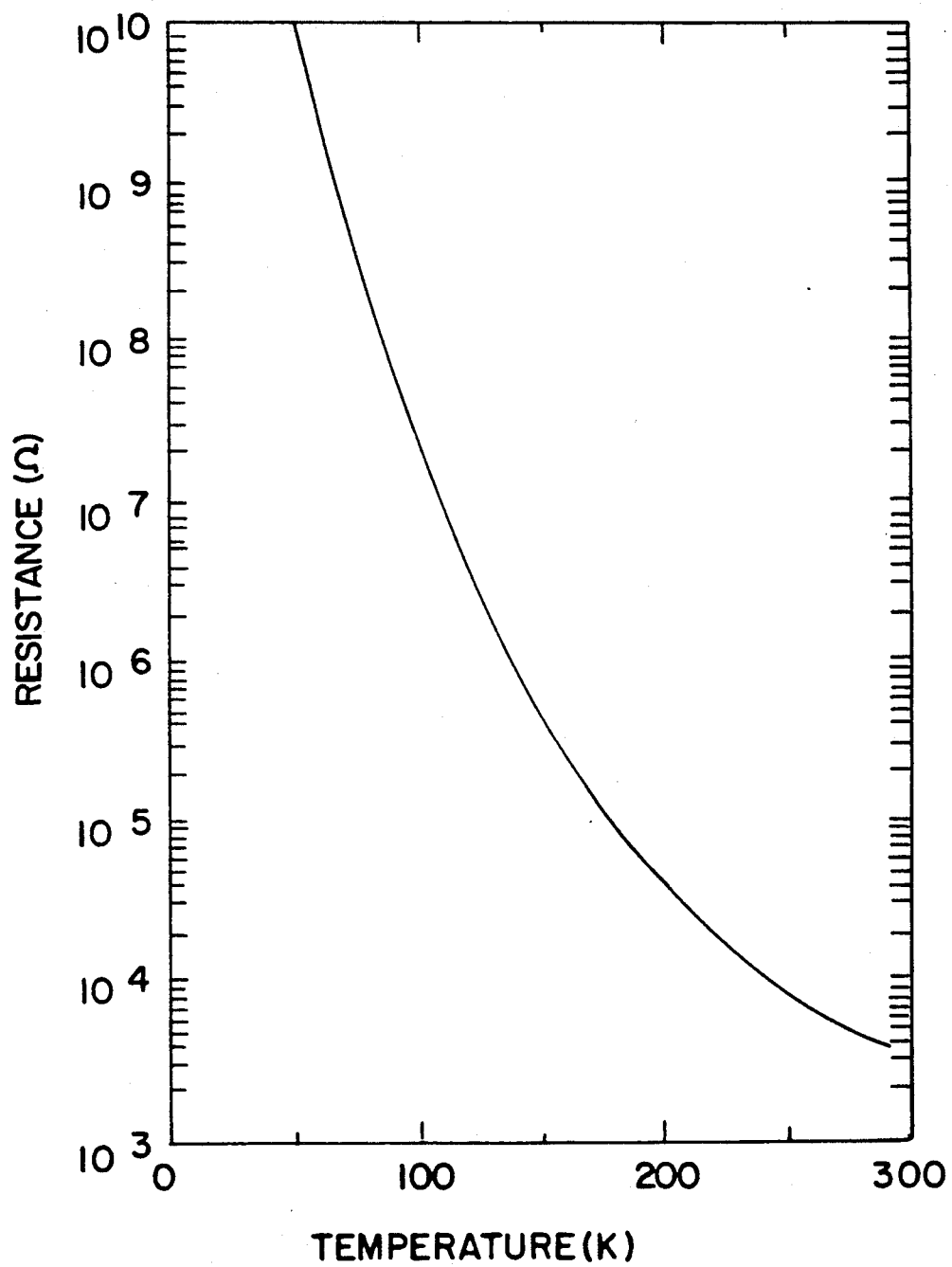

FIGS. 4A-C show resistance versus temperature data of a crossover with its lower YBCO layer photolithographically patterned and etched using an ion mill. FIG. 4A is the resistance versus temperature plot of the upper YBCO layer. The transition temperature, T$_c$, is 87K. FIG. 4B is the resistance versus temperature plot of the SrTiO$_3$ insulating layer measured between the upper and the lower YBCO layers. FIG. 4C is the resistance versus temperature plot of the bottom YBCO layer. The transition temperature, T$_c$, is 86K.

EXAMPLE 2

A 12.5$\times$12.5$\times$1 mm$^3$ cleaved and polished (100) MgO substrate was cleaned successively in an ultrasonic bath with xylene, trichlorethylene, isopropyl alcohol and ethanol, rinsed with methanol, and blown dry with N$_2$. The superconductor films are deposited from stoichiometric YBCO targets pressed and sintered from calcined powder into disks 25 mm in diameter and 3 mm thick. The insulating layer is deposited from SrTiO$_3$ powder pressed into a disk of the same size. Before each deposition, the surface of the targets are ground with #400 emery paper, polished on a latex sheet and blown with N$_2$. Each layer is deposited in turn using the 248 nm pulses (18 ns full width at half maximum) from a Questek 2820 excimer laser. A 5.4$\times$14 mm$^2$ aperture selects the uniform portion of the beam, which is focused by a 0.15 m focal length lens onto the target at an angle of incidence of 45°. The target is glued to one end of a copper cylinder that rotates at about 60 rpm; the bearings for the shaft are mounted in a water-cooled block in a diffusion-pumped vacuum system. The substrate is clamped to a heater block which is coated with a layer of silver paste to insure good thermal contact. This block is resistively heated, and its temperature is monitored by an embedded Chromel-Alumel thermocouple. The substrate is 60 mm from the target, and aligned to intercept the central portion of the plume emanating from the target. A water-cooled plate partially shields the target from the thermal radiation emitted by the substrate heater block to prevent melting of the surface of the target.

The first step in the process is to outgas the heater and substrate by increasing the temperature to 740° C. as the chamber is evacuated to 5 $\mu$Torr. Then, the temperature is held constant while the gate valve is throttled and O$_2$ is bled in to maintain a pressure of 190 mTorr. The target is cleaned with 300 laser pulses at a rate of 5 per second with an energy density of 1.3 Jcm$^{-2}$. The first layer of YBCO is deposited for 5 minutes, at the same repetition rate and fluence, to a thickness of about 0.3 $\mu$m. The chamber is then back-filled with O$_2$ to 1 atmosphere and the heater power is reduced to allow the block to cool to 450° C. in about 15 minutes.

The sample is allowed to further cool down to 100° C. or less in another 15 minutes. The sample is then dismounted from the heater block in preparation for patterning. Shipley Microposit 1400-31 photoresist is spun on the YBCO film for 30 sec at 5000 RPM and baked at 70° C. for 5 minutes. This produces a $\frac{1}{2}$ to 1 micrometer thick layer of resist that entirely covers the YBCO film. The desired pattern is then exposed on the resist using a projection mask aligner. The resist is developed for 60 seconds using Microposit developer. The portion of the thin film which is not covered by the photoresist can then be etched away using either an ion mill or various chemical etchants. An example of a suitable etchant is dilute nitric acid.

When using nitric acid in etching, the sample is submerged in a 0.1% solution of nitric acid in water for about 45 seconds until the film is entirely etched in those regions where the resist have been exposed. The substrate is then rinsed in water and blown dry.

When using an ion mill in etching, the substrate is clamped on a large copper block heat sink beneath an ion mill in a vacuum system. After evacuation is complete, argon (Ar) is bled into the system and a beam of Ar ions is used to etch away the chosen portions of the YBCO film. Typically, a 300 nm thick film is milled for about 15 minutes in a 450 V, 1.5 mA/cm$^2$ beam of Ar ions.

After etching is completed by either method, the resist covering the remaining parts of the YBCO film is stripped using ethanol or acetone in an ultrasonic bath. At this point, the surface of the YBCO film is restored by submerging the substrate in a solution of 1% bromine in methanol for 10 seconds. The sample is rinsed in pure methanol and then blown dry. Immediately afterwards, the sample is mounted in a laser system's vacuum chamber in preparation for deposition of the insulating layer.

An appropriate evaporation mask, if desired, may be is placed on top of the substrate and both are clamped to the heater block. The YBCO target is replaced with a polished SrTiO$_3$ target. As the chamber is evacuated to 3 μTorr, the heater block is outgassed at the relatively low temperature of 200° C. to minimize the loss of oxygen from the YBCO layer. The block temperature is then rapidly raised to 680° C., O$_2$ is bled in to 190 mTorr, and the target is cleaned as described above. After opening the shutter, SrTiO$_3$ is deposited at a repetition rate of 4.8 Hz and a laser fluence of 1.3 Jcm$^{-2}$ so that the thickness of the SrTiO$_3$ is preferably between 0.1 to 0.4 μm. The same cooling procedure is used.

The sample is then dismounted from the heater block in preparation for patterning. Shipley Microposit 1400-31 photoresist is spun on the insulating layer for 30 sec at 2000 RPM and baked at 70° C. for 6 to 7 minutes. This produces a 2 to 3 micrometer thick layer of resist that entirely covers the insulating layer. This relatively thick layer is necessary to withstand the long subsequent ion mill etch. The desired pattern, in this case, a hole, is then exposed on the resist using a Canon projection mask aligner. The aligner is defocused if it is desirable to create a hole with beveled wall. The resist is developed for 60 seconds using Microposit developer. The portion of the thin film which is not covered by the photoresist can then be etched away using an ion mill.

When using an ion mill in etching, the substrate is clamped on a large copper block heat sink beneath an ion mill in a vacuum system. After evacuation is complete, argon (Ar) is bled into the system and a beam of Ar ions is used to etch away the chosen portions of the insulating layer. Typically, a 300 nm thick film is milled for about 30 minutes in a 600 V, 1.5 mA/cm$^2$ beam of Ar ions. The last 3 to 5 minutes of the milling is preferably performed at 450 V to reduce damage to the underlying YBCO layer.

After etching is completed, the resist covering the remaining parts of the insulating layer is stripped using ethanol or acetone in an ultrasonic bath. Immediately afterwards, the sample is mounted in a laser system's vacuum chamber in preparation for deposition of the third layer.

A polished YBCO target is inserted in the chamber and the sample is outgassed at 200° C. until the pressure falls to 3 μTorr. The temperature is quickly raised to 740° C. and O$_2$ is bled in to 200 mTorr. The third layer is deposited at a repetition rate of 4.8 Hz and a laser fluence of 1.3 J/cm$^2$ so that the thickness of the third layer is preferably 0.3 to 0.4 μm. After the usual cooling procedure, the third layer is patterned using the photolithographic process.

Shipley Microposit 1400-31 photoresist is spun on the sample at 5000 RPM for 30 seconds, and then baked at 70° C. for 5–7 min. The pattern is then exposed, and the resist developed in microposit developer for approximately 60 seconds. The back of the sample is then coated with vacuum grease and clamped onto a large Cu block heat sink, and etched for a total of approximately 10 to 20 min in a 450 V, 1.5 mA/cm$^2$ beam of Ar ions. To prevent heating damage to the YBCO, the milling can be done in intervals of 5 min with approximately 15 min cooling intervals between, and aluminum foil may be used to protect portions of the device that require less etching time. After milling, the photoresist is stripped off in 30 sec in an ultrasonic ethanol bath.

Figure 5A:
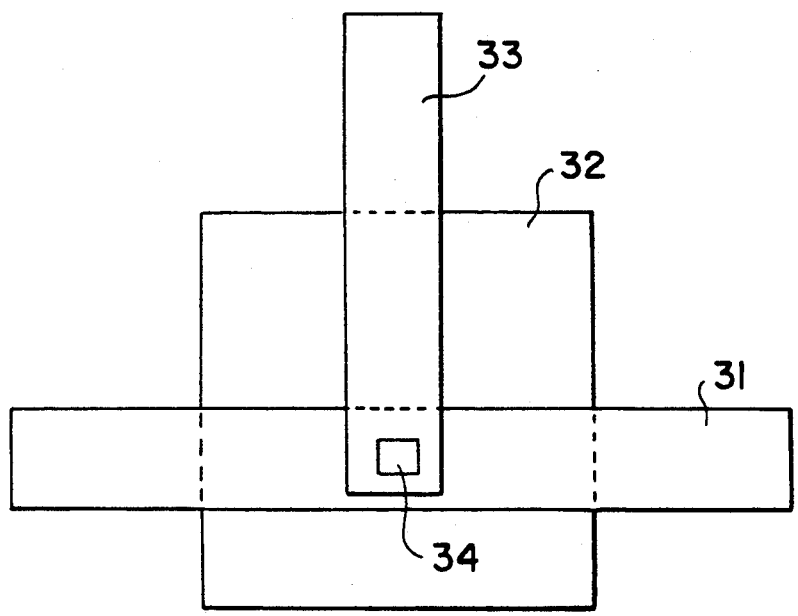
FIG. 5A and 5B are, respectively, a plan and cross sectional view of an example of a device with a window contact constructed according to the present invention.
Figure 5B:
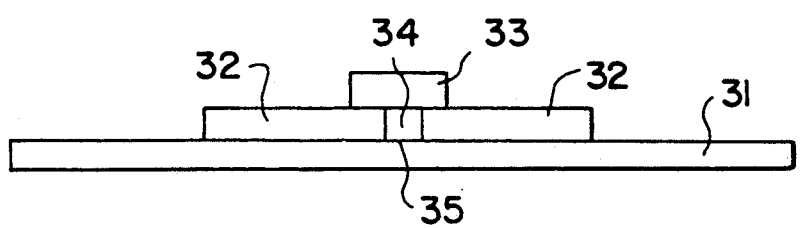

FIG. 5A–B show a microelectronic device with a window contact according to the present invention. Referring to FIG. 5A, the microelectric device comprises a lower superconducting layer 31, an insulating layer 32 having a hole 34, and a upper superconducting layer 33. FIG. 5B is a cross-sectional view of the microelectronic device along a longitudinal direction parallel to lower superconducting layer 31 and including hole 34. Lower superconducting layer 31 and upper superconducting layer 33 make contact at location 35 thereby allowing electrical conduction between lower superconducting layer 31 and upper superconducting layer 33.

FIG. 6 shows resistance versus temperature data for a window contact of dimension 18 μm×99 μm wherein all the layers are patterned photolithographically. The electrical contacts to the sample were made in such a way so as to include parts of the upper and lower YBCO stripes as well as the window contact in the resistance measurement.

Figure 7:
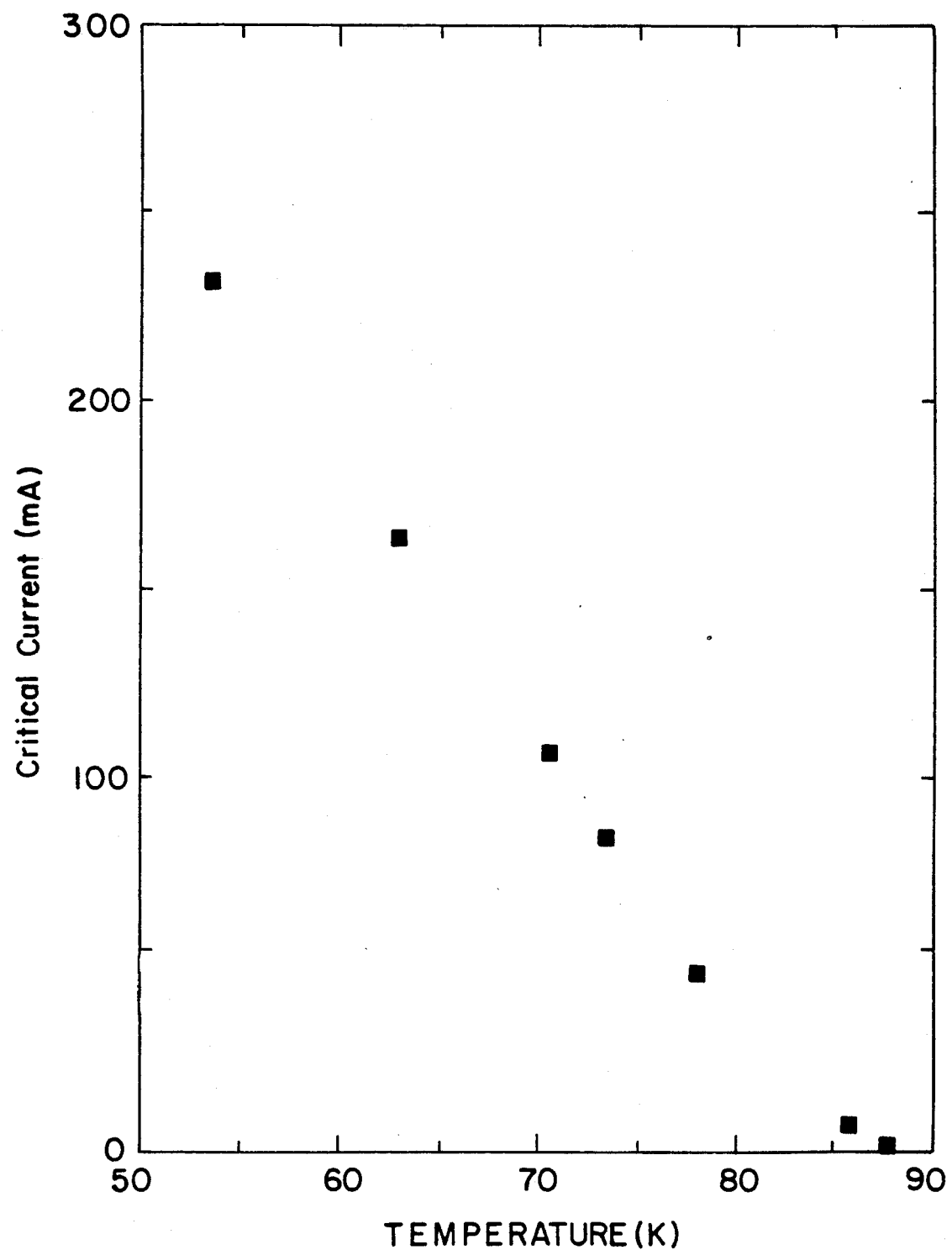
FIG. 7 shows the critical current versus temperature for the window contact in FIG. 6.

FIG. 7 shows the critical current versus temperature for the 18 μm×99 μm window contact.

The invention is described in terms of the preferred embodiments. It will be realized that other modifications and variations will be apparent from the above description and for practice of the invention to those skilled in the art. These modifications and variations are intended to be within the scope of the present invention and the invention is not intended to be limited except by the following appended claims.

What is claimed is:

1. A microelectronic device comprising a substrate; a first thin film of high T$_c$ metal oxide superconductor material deposited on said substrate; a second thin film deposited on said first thin film, said second thin film having at least one hole, said second thin film being comprised of a material having high resistivity at temperatures below T$_c$, and having a microstructure which is epitaxial; and a plurality of layers deposited within said hole.

2. The device according to claim 1 wherein said plurality of layers comprises a first layer of superconductor material in contact with said first thin film, a second layer of insulating material on top of said first layer, and a third layer of superconductor material on top of said second layer.

3. The device according to claim 1 wherein said plurality of layers comprises a first layer of superconductor material in contact with said first thin film, a second layer of metal on top of said first layer, and a third layer of superconductor material on top of said second layer of metal.

4. A microelectronic device comprising a substrate; a first thin film of high $T_c$ metal oxide superconductor material deposited on said substrate; a second thin film deposited on said first thin film, said second thin film having at least one hole, said second thin film being comprised of a material having high resistivity at temperatures below $T_c$, and having a microstructure which is epitaxial, and a third thin film of high $T_c$ metal oxide superconductor material, said third thin film making contact with said first thin film through said hole, wherein said second thin film has first and second opposite surfaces, and wherein said hole extends from said first surface of said second thin film facing said first thin film to a second surface of said second thin film away from said first surface, said hole having a beveled wall for providing a slope to guide the deposition of said third thin film from said second surface into said hole.

* * * * *